United States Patent
Kim et al.

(10) Patent No.: US 11,502,652 B2
(45) Date of Patent: Nov. 15, 2022

(54) SUBSTRATE COMPRISING CAPACITOR CONFIGURED FOR POWER AMPLIFIER OUTPUT MATCH

(71) Applicant: QUALCOMM Incorporated, San Diego, CA (US)

(72) Inventors: Daniel Daeik Kim, San Diego, CA (US); Paragkumar Ajaybhai Thadesar, San Diego, CA (US); Changhan Hobie Yun, San Diego, CA (US); Sameer Sunil Vadhavkar, San Diego, CA (US); Nosun Park, Incheon (KR)

(73) Assignee: QUALCOMM Incorporated, San Diego, CA (US)

( * ) Notice: Subject to any disclaimer, the term of this patent is extended or adjusted under 35 U.S.C. 154(b) by 181 days.

(21) Appl. No.: 16/870,383

(22) Filed: May 8, 2020

(65) Prior Publication Data

US 2021/0351750 A1 Nov. 11, 2021

(51) Int. Cl.
*H03F 3/14* (2006.01)
*H03F 3/213* (2006.01)
(Continued)

(52) U.S. Cl.
CPC ............. *H03F 3/213* (2013.01); *H01L 23/34* (2013.01); *H01L 23/66* (2013.01); *H03F 1/565* (2013.01);
(Continued)

(58) Field of Classification Search
CPC .......... H03F 3/213; H03F 1/565; H03F 3/195; H03F 2200/387; H03F 2200/391; H03F 2200/48; H01L 23/34; H01L 23/66; H01L 2223/6655; H01L 2924/19041; H01L 23/642; H01L 23/645; H01L 2221/68345; H01L 2221/68381; H01L 2223/6677; H01L 2224/131; H01L 2224/16227; H01L 2924/10272; H01L 2924/12041;
(Continued)

(56) References Cited

U.S. PATENT DOCUMENTS 9,634,641 B2 * 4/2017 Nishimura ............. H03H 9/706
2002/0140081 A1 * 10/2002 Chou ........................ H05K 1/16
257/700

(Continued)

OTHER PUBLICATIONS

International Search Report and Written Opinion—PCT/US2021/029680—ISA/EPO—dated Aug. 10, 2021.

*Primary Examiner* — Khanh V Nguyen
(74) *Attorney, Agent, or Firm* — Loza & Loza, LLP/Qualcomm

(57) ABSTRACT

A device that includes a substrate and a power amplifier coupled to the substrate. The substrate includes at least one dielectric layer, a plurality of interconnects, and a capacitor configured to operate as an output match element, where the capacitor is defined by a plurality of capacitor interconnects. The power amplifier is coupled to the capacitor. The capacitor is configured to operate as an output match element for the power amplifier. The substrate includes an inductor coupled to the capacitor, where the inductor is defined by at least one inductor interconnect. The capacitor and the inductor are configured to operate as a resonant trap or an output match element.

27 Claims, 17 Drawing Sheets

PROFILE VIEW

(51) Int. Cl.
  *H01L 23/34*  (2006.01)
  *H01L 23/66*  (2006.01)
  *H03F 1/56*  (2006.01)
  *H03F 3/195*  (2006.01)

(52) U.S. Cl.
  CPC ...... *H03F 3/195* (2013.01); *H01L 2223/6655* (2013.01); *H01L 2924/19041* (2013.01); *H03F 2200/387* (2013.01); *H03F 2200/391* (2013.01); *H03F 2200/48* (2013.01)

(58) Field of Classification Search
  CPC ..... H01L 2924/1421; H01L 2924/1434; H01L 2924/15313; H01L 2924/19042; H01L 2924/30111; H01L 21/6835; H01L 23/5383; H01L 2924/19105
  See application file for complete search history.

(56) References Cited

U.S. PATENT DOCUMENTS

| | | | |
|---|---|---|---|
| 2018/0316319 A1 | 11/2018 | Kim et al. | |
| 2019/0304887 A1* | 10/2019 | Ganesan | H01L 23/3107 |
| 2020/0051942 A1* | 2/2020 | Nakazawa | H01L 24/13 |

* cited by examiner

PROFILE VIEW

PROFILE VIEW

PROFILE VIEW

PLAN VIEW

PROFILE VIEW

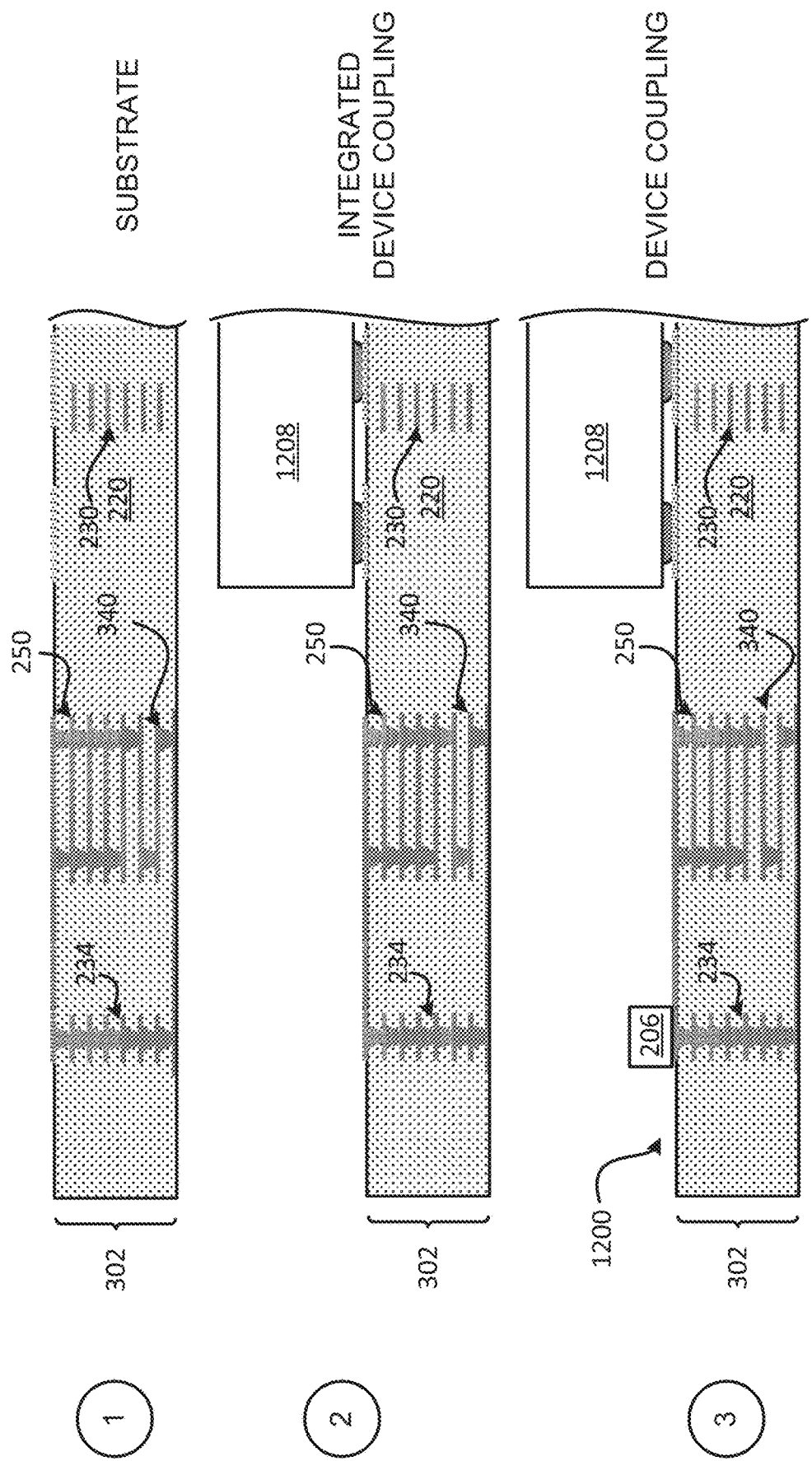

```
┌─────────────────────────────────────────────┐
│ PROVIDE A SUBSTRATE COMPRISING AN INDUCTOR  │
│ AND CAPACITOR EMBEDDED IN THE SUBSTRATE,    │
│ FORMING THE SUBSTRATE INCLUDES FORMING AT   │
│ LEAST ONE DIELECTRIC LAYER, FORMING A PLURALITY │─ 1405
│ OF INTERCONNECTS, AND FORMING A CAPACITOR   │
│ CONFIGURED TO OPERATE AS AN OUTPUT MATCH    │
│ ELEMENT, WHERE THE CAPACITOR IS DEFINED BY A│
│ PLURALITY OF CAPACITOR INTERCONNECTS        │
└─────────────────────────────────────────────┘
                      ▼
┌─────────────────────────────────────────────┐
│  COUPLE INTEGRATED DEVICE(S) TO THE SUBSTRATE │─ 1410
└─────────────────────────────────────────────┘
                      ▼
┌─────────────────────────────────────────────┐
│ COUPLE DEVICES (E.G., POWER AMPLIFIER, MATCH│
│ OUTPUT) TO THE FIRST SUBSTRATE (E.G., COUPLE│
│ POWER AMPLIFIER TO A CAPACITOR, WHERE THE   │─ 1415
│ CAPACITOR IS CONIFGURED TO OPERATE AS AN    │
│ OUTPUT MATCH ELEMENT FOR THE POWER AMPLIFIER│
└─────────────────────────────────────────────┘
```

SUBSTRATE COMPRISING CAPACITOR CONFIGURED FOR POWER AMPLIFIER OUTPUT MATCH

FIELD

Various features relate to a substrate that includes a capacitor, but more specifically to a substrate that includes a capacitor configured for power amplifier output match.

BACKGROUND

FIG. 1 illustrates a package 100 that includes a substrate 102, an integrated device 104, and a power amplifier 106. The substrate 102 includes at least one dielectric layer 120, a plurality of interconnects 122, and a plurality of solder interconnects 124. A plurality of solder interconnects 144 is coupled to the substrate 102 and the integrated device 104. The power amplifier 106 is coupled to the substrate 102. The power amplifier 106 may generate a lot of heat. Heat dissipation for the package 100 is always a challenge, which can affect the performance of the package 100. There is an ongoing need to provide better performing packages.

SUMMARY

Various features relate to a substrate that includes a capacitor, but more specifically to a substrate that includes a capacitor configured for power amplifier output match.

One example provides a device that includes a substrate and a power amplifier coupled to the substrate. The substrate includes at least one dielectric layer, a plurality of interconnects, and a capacitor configured to operate as an output match element, where the capacitor is defined by a plurality of capacitor interconnects. The power amplifier is coupled to the capacitor. The capacitor is configured to operate as an output match element for the power amplifier.

Another example provides an apparatus that includes a substrate and means for power amplification coupled to the substrate. The substrate includes at least one dielectric layer, a plurality of interconnects, and means for capacitance configured to operate as an output match element. The means for power amplification is coupled to the means for capacitance. The means for capacitance is configured to operate as an output match element for the means for power amplification.

Another example provides a method for fabricating a device. The method provides a substrate. Providing the substrate includes forming at least one dielectric layer. Providing the substrate includes forming a plurality of interconnects. The method forms a capacitor configured to operate as an output match element, where the capacitor is defined by a plurality of capacitor interconnects. The method couples a power amplifier to the substrate. The power amplifier is coupled to the capacitor. The capacitor is configured to operate as an output match element for the power amplifier.

BRIEF DESCRIPTION OF THE DRAWINGS

Various features, nature and advantages may become apparent from the detailed description set forth below when taken in conjunction with the drawings in which like reference characters identify correspondingly throughout.

FIG. 13 illustrates an exemplary sequence for fabricating a package that includes an integrated device and a substrate that includes a capacitor configured for power amplifier output match.

FIG. 14 illustrates an exemplary flow diagram of a method for fabricating a package that includes an integrated device and a substrate that includes a capacitor configured for power amplifier output match.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a substrate and a power amplifier coupled to the substrate. The substrate includes at least one dielectric layer, a plurality of interconnects, and a capacitor configured to operate as an output match element, where the capacitor is defined by a plurality of capacitor interconnects. The power amplifier is coupled to the capacitor. The capacitor is configured to operate as an output match element for the power amplifier. The substrate includes an inductor coupled to the capacitor, where the inductor is defined by at least one inductor interconnect. The capacitor and the inductor may be configured to operate as a resonant trap or an output match element. An integrated device may be coupled to the substrate. In addition to providing output match for the power amplifier, the capacitor may be configured to help dissipate heat generated by the power amplifier. This in turns, helps improve the performance of the device and/or the package.

Figure 1:
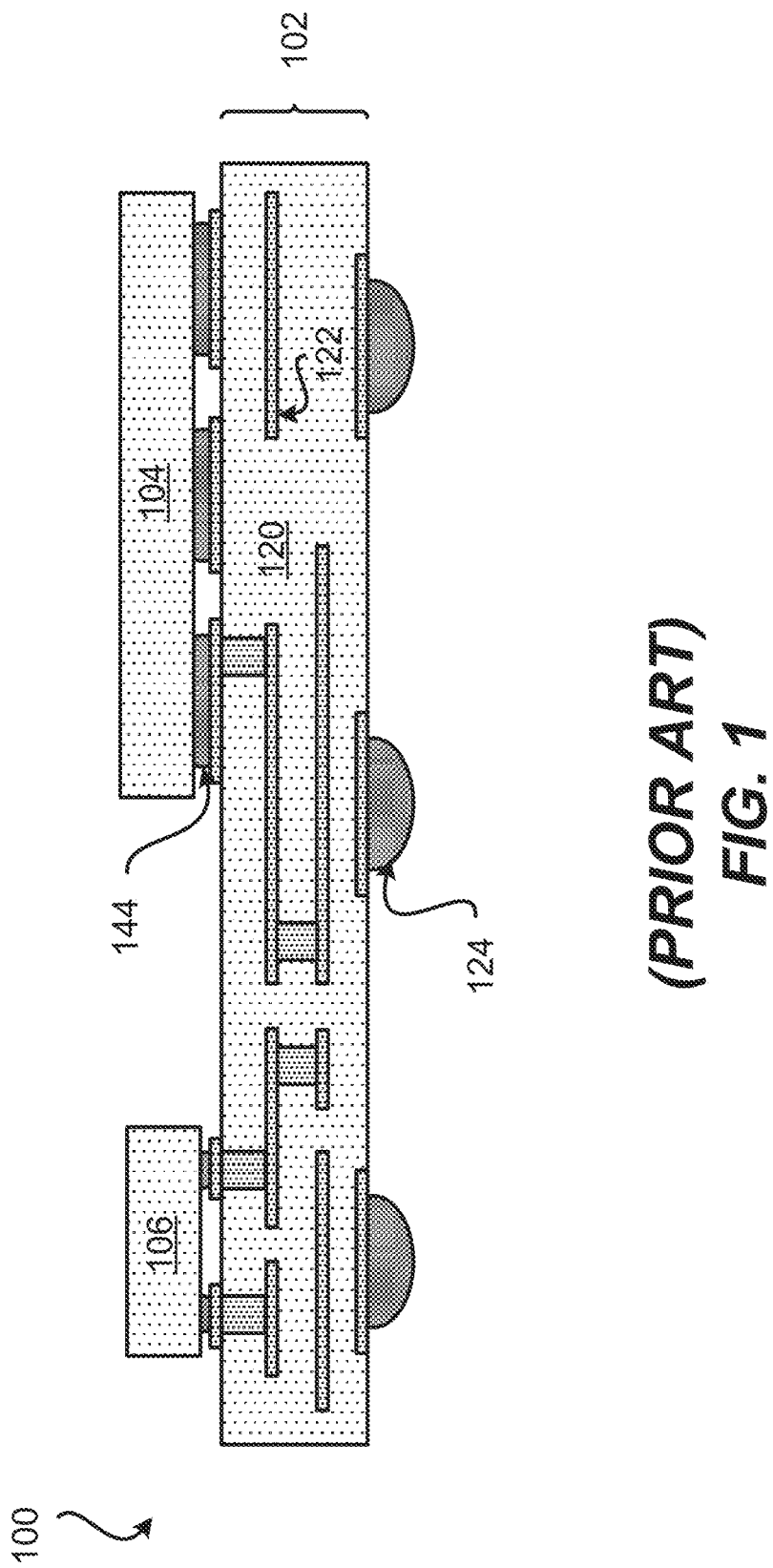
FIG. 1 illustrates a profile view of a package that includes an integrated device and a substrate.
Figure 2:
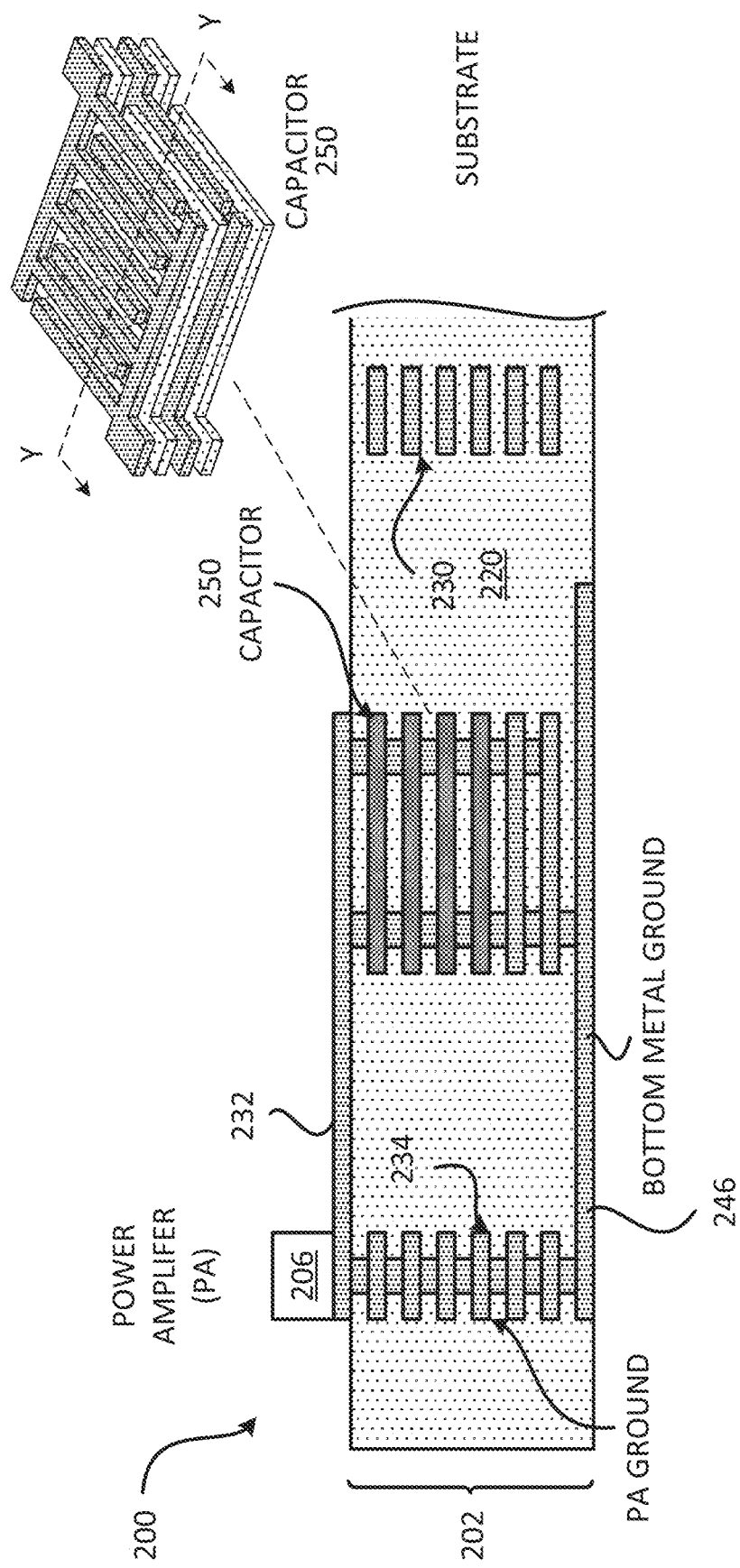
FIG. 2 illustrates a profile view of a substrate that includes a capacitor configured for power amplifier output match.

Exemplary Substrate Comprising Capacitor Configured as an Output Match Element FIG. 2 illustrates a profile view of a device 200 that includes a substrate having an embedded capacitor that is configured to operate as an output match element for a power amplifier. As will be further described below, the embedded capacitor may be further configured to dissipate heat generated by the power amplifier.

The device 200 includes a substrate 202 and a power amplifier 206 coupled to the substrate 202. The power amplifier 206 may be configured to amplify at least one electrical signal (e.g., electrical signal from at least one transmit path). In some implementations, the power amplifier 206 may be configured to be coupled at least one antenna. The power amplifier 206 may be means for power amplifying. The power amplifier 206 may generate a lot of heat which needs to be properly dissipated. As will be further described below, a capacitor that is embedded in the substrate, may be coupled to the power amplifier 206 to help dissipate heat generated by the power amplifier 206.

The substrate 202 includes at least one dielectric layer 220 and a plurality of interconnects 230. Different implementations may use different types of the substrate. The substrate 202 may include a laminated substrate, a coreless substrate (e.g., coreless embedded trace substrate (ETS)), or a substrate that includes a core layer.

The substrate 202 further includes at least one interconnect 232, a plurality of ground interconnects 234, at least one bottom ground interconnect 246, and a capacitor 250. The capacitor 250 is coupled to the power amplifier 206. The capacitor 250 may be electrically coupled to the power amplifier 206 through at least one interconnect 232. At least one electrical current (e.g., electrical signal) may travel between the power amplifier 206 and the capacitor 250 through the at least one interconnect 232. The capacitor 250 is configured to operate as an output match element for the power amplifier 206. The output matching that is provided by the capacitor 250 (e.g., output match element) may be impedance matching that helps match the output impedance of the power amplifier 206 to an input load to another component (e.g., integrated device, die) so as to maximize energy transfer between the power amplifier 206 and the other component. The capacitor 250 may be defined by a plurality of capacitor interconnects. The capacitor 250 may be defined by at least one metal layer of the substrate 202. The capacitor 250 may be embedded in the substrate 202. As will be further described below, the capacitor 250 may include several rows of ground capacitor interconnects and several rows of capacitor interconnects that are interleaved with each other. The capacitor 250 may be means for capacitance. Examples of the capacitor 250 are further illustrated and described below in at least FIGS. 6-8.

The power amplifier 206 may be coupled to the capacitor 250 through the plurality of ground interconnects 234 and the at least one bottom ground interconnect 246. For example, ground may travel between the power amplifier 206 and the capacitor 250 through the plurality of ground interconnects 234 and the at least one bottom ground interconnect 246. It is noted that the at least one bottom ground interconnect 246 may be an interconnect located on the lowest metal layer of the substrate 202 or interconnect located on any of the metal layer of the substrate 202. The at least one bottom ground interconnect 246 may be an interconnect located on a metal layer that is below the capacitor 250. The power amplifier 206 and/or the capacitor 250 may be coupled to other components (e.g., integrated device, die) through the plurality of interconnects 230.

In addition to providing output matching (e.g., impedance matching), the capacitor 250 may be configured as a heat spreader to dissipate heat generated by the power amplifier 206. The design and/or shape of the capacitor 250 is such that the capacitor 250 is able to dissipate more heat than another capacitor (e.g., surface mounted capacitor) of similar capacitance. For example, a surface mounted capacitor that has a capacitance of approximately 0.9 picofarad (pF) may be able to dissipate heat such that for approximately 1 watt (W) of power, the junction temperature of the surface mounted capacitor may reach 43 degrees Celsius. In contrast, the capacitor 250 may have a capacitance of approximately 0.9 picofarad (pF), and may be able to dissipate heat such that for approximately 1 watt (W) of power, the junction temperature of the capacitor 250 (e.g., capacitor junction temperature) may reach at most 23 degrees Celsius, which is substantially less than the junction temperature for a surface mounted capacitor. In some implementations, the junction temperature may be defined as a transistor junction temperature. In some implementations, the junction temperature may be defined as the temperature for a transistor in a device coupled (directly or indirectly) to the capacitor. In some implementations, the junction temperature may be defined as the temperature of the power amplifier. In some implementations, the junction temperature may be defined as the temperature of one or more output match elements (e.g., capacitor, inductor). Thus, the junction temperature as used in the disclosure is not limited to a temperature of a capacitor, and may refer to the temperature for other component(s).

Figure 3:
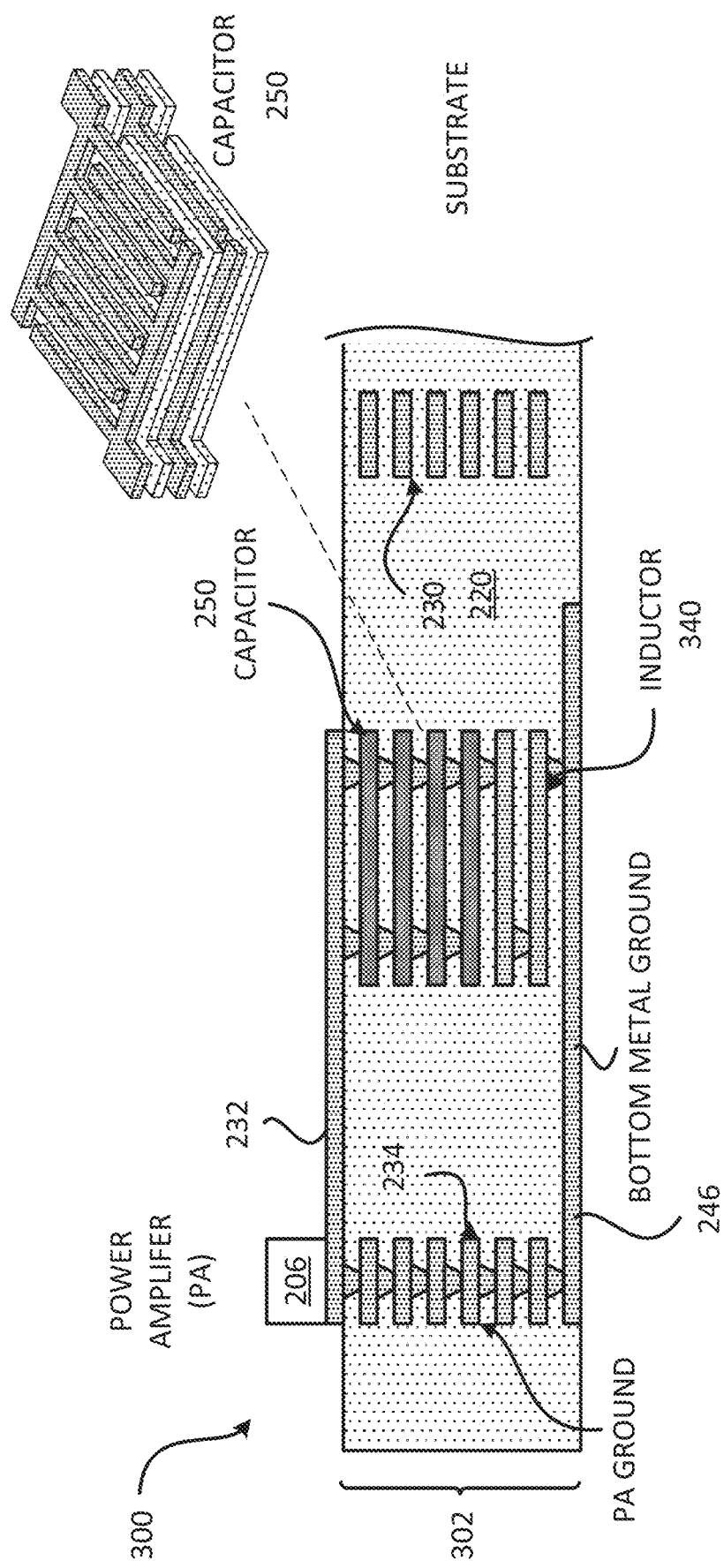
FIG. 3 illustrates a profile view of another substrate that includes a capacitor configured for power amplifier output match.

FIG. 3 illustrates a device 300 that includes the substrate 302 and the power amplifier 206. The device 300 is similar to the device 200, and may include similar components as the device 200. The substrate 302 is similar to the substrate 202, and may include similar components as the substrate 202. As shown in FIG. 3, the substrate 302 includes at least one dielectric layer 220, the plurality of interconnects 230, at least one interconnect 232, the plurality of ground interconnects 234, at least one bottom ground interconnect 246, the capacitor 250 and an inductor 340. The inductor 340 may be formed from at least one inductor interconnect. The inductor 340 may be formed on at least one metal layer of the substrate 302. The inductor 340 may include a spiral inductor.

The inductor 340 is configured to be coupled (e.g., electrically coupled) to the capacitor 250. At least one interconnect may be used to couple the inductor 340 to the capacitor 250, and vice versa. The capacitor 250 may be located over the inductor 340 in the substrate. Both the capacitor 250 and the inductor 340 may be embedded in the substrate 302. The combination of the capacitor 250 and the inductor 340 may be configured to operate as a resonant trap or an output match element for the power amplifier 206. The output matching that is provided by the capacitor 250 and the inductor 340 may be impedance matching that helps match the output impedance of the power amplifier 206 to an input load to another component (e.g., integrated device, die) so as to maximize energy transfer between the power amplifier 206 and the other component.

The power amplifier 206 may be coupled to the inductor 340 through the plurality of ground interconnects 234 and the at least one bottom ground interconnect 246. For example, ground may travel between the power amplifier 206 and the inductor 340 through the plurality of ground interconnects 234 and the at least one bottom ground interconnect 246. It is noted that the at least one bottom ground interconnect 246 may be an interconnect located on the lowest metal layer of the substrate 302 or interconnect located on any of the metal layer of the substrate 302. The at least one bottom ground interconnect 246 may be an interconnect located on a metal layer that is below the inductor 340.

The power amplifier 206 may be electrically coupled to the capacitor 250 through at least one interconnect 232. At least one electrical current (e.g., electrical signal) may travel between the power amplifier 206 and the capacitor 250 through the at least one interconnect 232. The power amplifier 206, the capacitor 250, and/or the inductor 340 may be coupled to other components (e.g., integrated device, die) through the plurality of interconnects 230.

Figure 4:
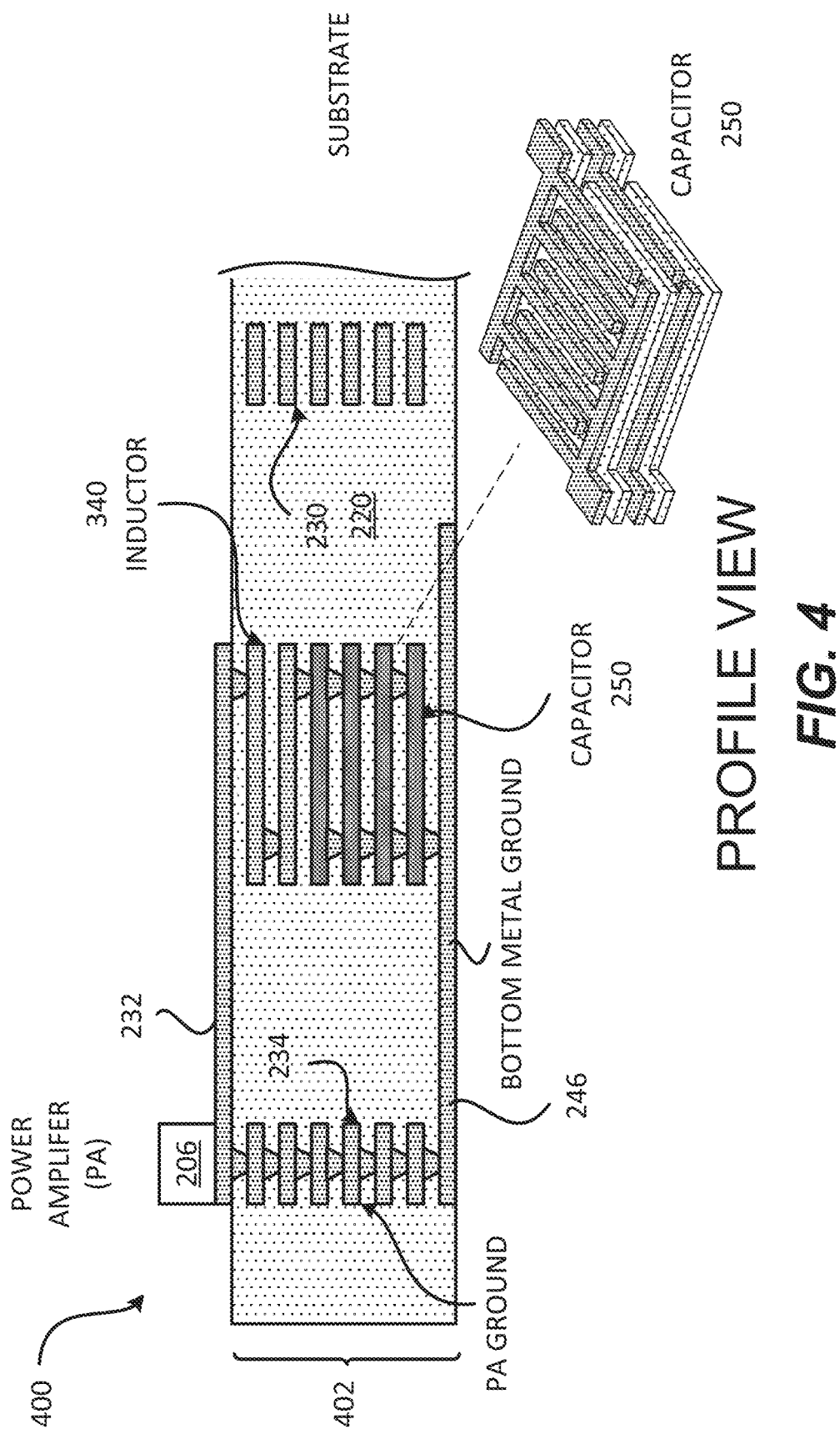
FIG. 4 illustrates a profile view of another substrate that includes a capacitor configured for power amplifier output match.

FIG. 4 illustrates a device 400 that includes the substrate 402 and the power amplifier 206. The device 400 is similar to the device 300, and may include similar components as the device 300. The substrate 402 is similar to the substrate 302, and may include similar components as the substrate 302. As shown in FIG. 4, the substrate 402 includes at least one dielectric layer 220, the plurality of interconnects 230, at least one interconnect 232, the plurality of ground interconnects 234, at least one bottom ground interconnect 246, the capacitor 250 and the inductor 340. The inductor 340 may be formed from at least one inductor interconnect. The inductor 340 may be formed on at least one metal layer of the substrate 402. The inductor 340 may include a spiral inductor.

The inductor 340 is configured to be coupled (e.g., electrically coupled) to the capacitor 250. At least one interconnect may be used to couple the inductor 340 to the capacitor 250, and vice versa. The inductor 340 may be located over the capacitor 250 in the substrate. Both the capacitor 240 and the inductor 340 may be embedded in the substrate 402. The combination of the capacitor 250 and the inductor 340 may be configured to operate as a resonant trap or an output match element for the power amplifier 206. As mentioned above, the output matching that is provided by the capacitor 250 and the inductor 340 may be impedance matching that helps match the output impedance of the power amplifier 206 to an input load to another component (e.g., integrated device, die) so as to maximize energy transfer between the power amplifier 206 and the other component.

The power amplifier 206 may be coupled to the capacitor 250 through the plurality of ground interconnects 234 and the at least one bottom ground interconnect 246. For example, ground may travel between the power amplifier 206 and the capacitor 250 through the plurality of ground interconnects 234 and the at least one bottom ground interconnect 246. It is noted that the at least one bottom ground interconnect 246 may be an interconnect located on the lowest metal layer of the substrate 402 or interconnect located on any of the metal layer of the substrate 402. The at least one bottom ground interconnect 246 may be an interconnect located on a metal layer that is below the capacitor 250.

The power amplifier 206 may be electrically coupled to the inductor 340 through at least one interconnect 232. At least one electrical current (e.g., electrical signal) may travel between the power amplifier 206 and the inductor 340 through the at least one interconnect 232. The power amplifier 206, the capacitor 250, and/or the inductor 340 may be coupled to other components (e.g., integrated device, die) through the plurality of interconnects 230.

Figure 5:
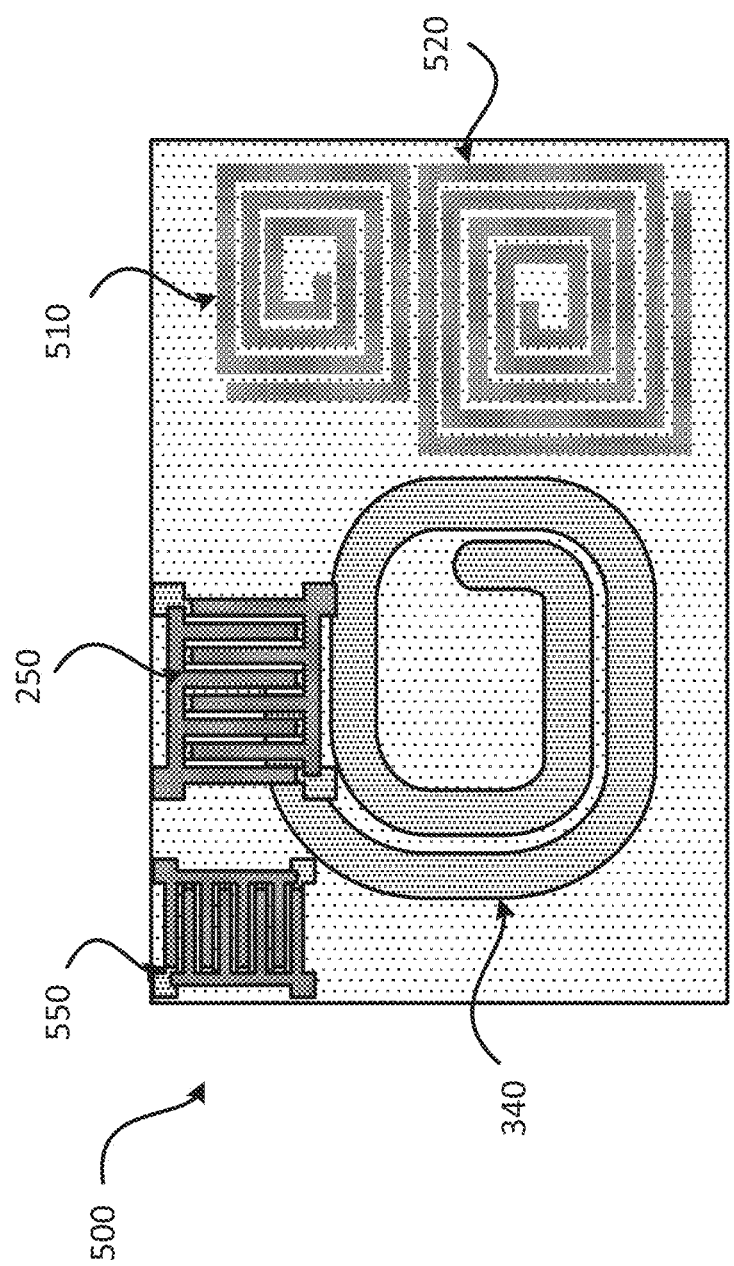
FIG. 5 illustrates a plan view of a substrate that includes a capacitor configured for power amplifier output match.

FIG. 5 illustrates a plan view of a device 500 that includes the substrate 302, the capacitor 250, an inductor 340, an inductor 510, an inductor 520, and a capacitor 550. The capacitor 550 may be similar to the capacitor 250, but the capacitor 550 may have a different shape, a different design and/or a different size. The inductor 510 and the inductor 520 may be coupled to at least one component of the device 500. The capacitor 550 may be coupled to at least one component of the device 500. The inductor 510 and/or the inductor 520 may be embedded inductor that are located in a substrate (e.g., 202, 302, 402).

The devices 200, 300, 400, and/or 500 may be or may include a package that includes the substrates 202, 302, and/or 402. The devices 200, 300, 400 and/or 500 may be implemented in a radio frequency front end (RFFE) package.

Figure 6:
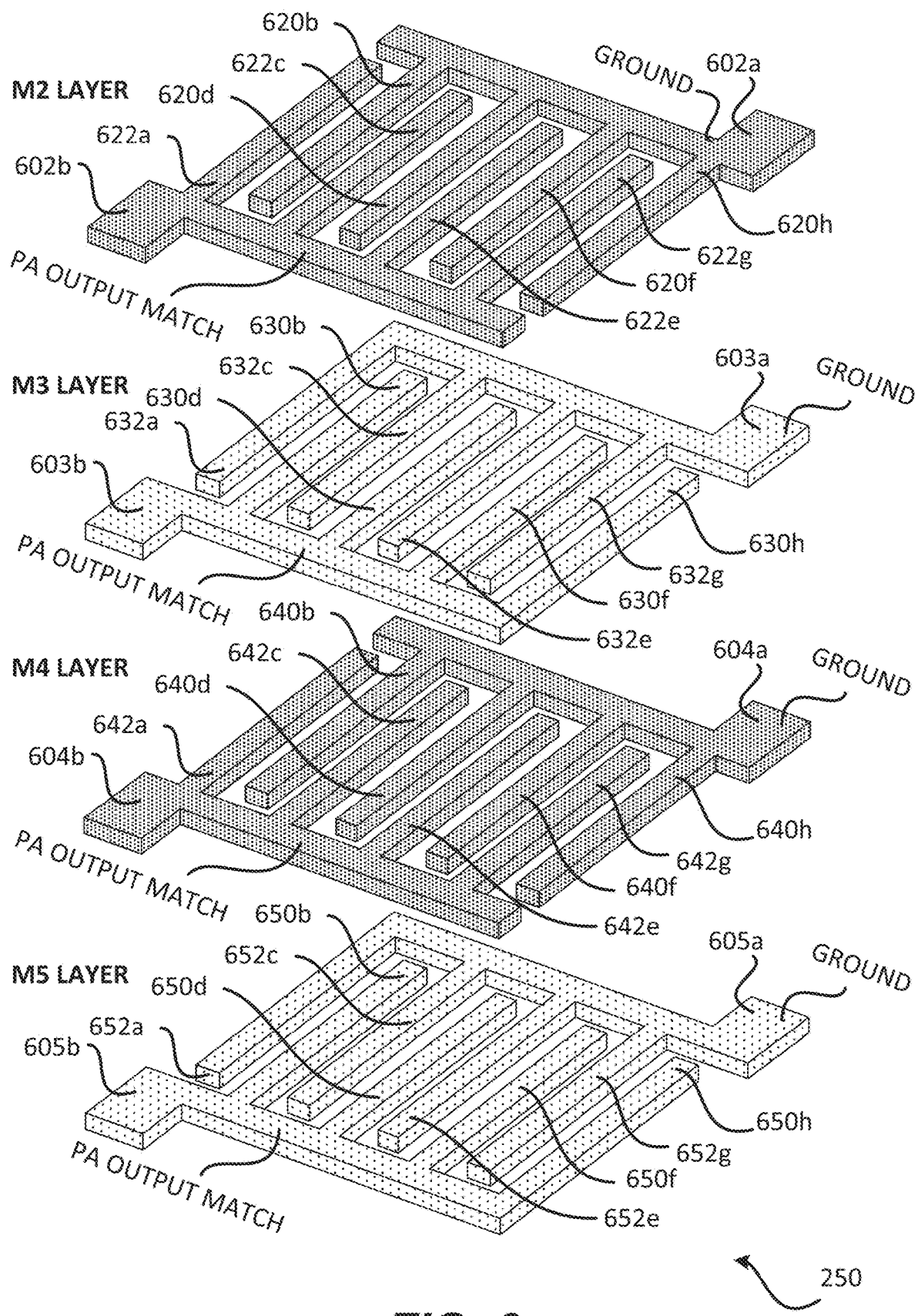
FIG. 6 illustrates an assembly view of a capacitor configured for power amplifier output match.

FIG. 6 illustrates an exemplary assembly view of the capacitor 250. The capacitor 250 may be formed and/or located on four (4) metal layers of a substrate. However, the capacitor 250 may be formed and/or located on at least one metal layer of a substrate. Different implementations may include a capacitor that are formed on less than four metal layers or more than four metal layers.

The capacitor 250 includes a first ground node 602a located on a first metal layer of a substrate (e.g., 202, 302, 402), a first output match node 602b located on the first metal layer of the substrate, a second ground node 603a located on a second metal layer of the substrate, a second output match node 603b located on the second metal layer of the substrate, a third ground node 604a located on a third metal layer of the substrate, a third output match node 604b located on the third metal layer of the substrate, a fourth ground node 605a located on a fourth metal layer of the substrate, and a fourth output match node 605b located on the fourth metal layer of the substrate.

The first ground node 602a may be coupled to the second ground node 603a (e.g., through ground vias). The second ground node 603a may be coupled to the third ground node 604a (e.g., through ground vias). The third ground node 604a may be coupled to the fourth ground node 605a (e.g., through ground vias). The first output match node 602b may be coupled to the second output match node 603b (e.g., through output match vias). The second output match node 603b may be coupled to the third output match node 604b (e.g., through output match vias). The third output match node 604b may be coupled to the fourth output match node 605b (e.g., through output match vias).

A ground node (e.g., 602a, 603a, 604a, 605a) of the capacitor 250 may be coupled to the power amplifier 206 through ground interconnects, as described in FIG. 2. An output match node (e.g., 602b, 603b, 604b, 605b) of the capacitor 250 may be coupled to the power amplifier 206 through interconnects, as described in FIG. 2. The ground node and/or the output match node of the capacitor 250 may be coupled to an inductor (e.g., 340).

The first ground node 602a includes at least two rows of first ground capacitor interconnects located on a first metal layer of a substrate. For example, the first ground node 602a includes first ground capacitor interconnects 620b, 620d, 620f and 620h. The first output match node 602b includes at least two rows of first capacitor interconnects located on the first metal layer of a substrate. For example, the first output match node 602b includes first capacitor interconnects 622a, 622c, 622e and 622g.

The second ground node 603a includes at least two rows of second ground capacitor interconnects located on a second metal layer of a substrate. For example, the second ground node 603a includes second ground capacitor interconnects 630a, 630c, 630e and 630g. The second output match node 603b includes at least two rows of second capacitor interconnects located on the second metal layer of a substrate. For example, the second output match node 603b includes second capacitor interconnects 632b, 632d, 632f and 632h.

The third ground node 604a includes at least two rows of third ground capacitor interconnects located on a third metal layer of a substrate. For example, the third ground node 604a includes third ground capacitor interconnects 640b, 640d, 640f and 640h. The third output match node 604b includes at least two rows of third capacitor interconnects located on the third metal layer of a substrate. For example, the third output match node 604b includes third capacitor interconnects 642a, 642c, 642e and 642g.

The fourth ground node 605a includes at least two rows of fourth ground capacitor interconnects located on a fourth metal layer of a substrate. For example, the fourth ground node 605a includes fourth ground capacitor interconnects 650a, 650c, 650e and 650g. The fourth output match node 605b includes at least two rows of fourth capacitor interconnects located on the fourth metal layer of a substrate. For example, the fourth output match node 605b includes fourth capacitor interconnects 652b, 652d, 652f and 652h.

The capacitor 250 may include a different number of capacitor interconnects (e.g., different number of rows of capacitor interconnects). The metal layers of the substrate on which the capacitor 250 are formed are arbitrary. In the example of FIG. 6, the capacitor 250 is formed on the M2 layer, M3 layer, the M4 layer and the M5 layer of a substrate. However, the capacitor 250 may be formed on different metal layers of the substrate.

Figure 9:
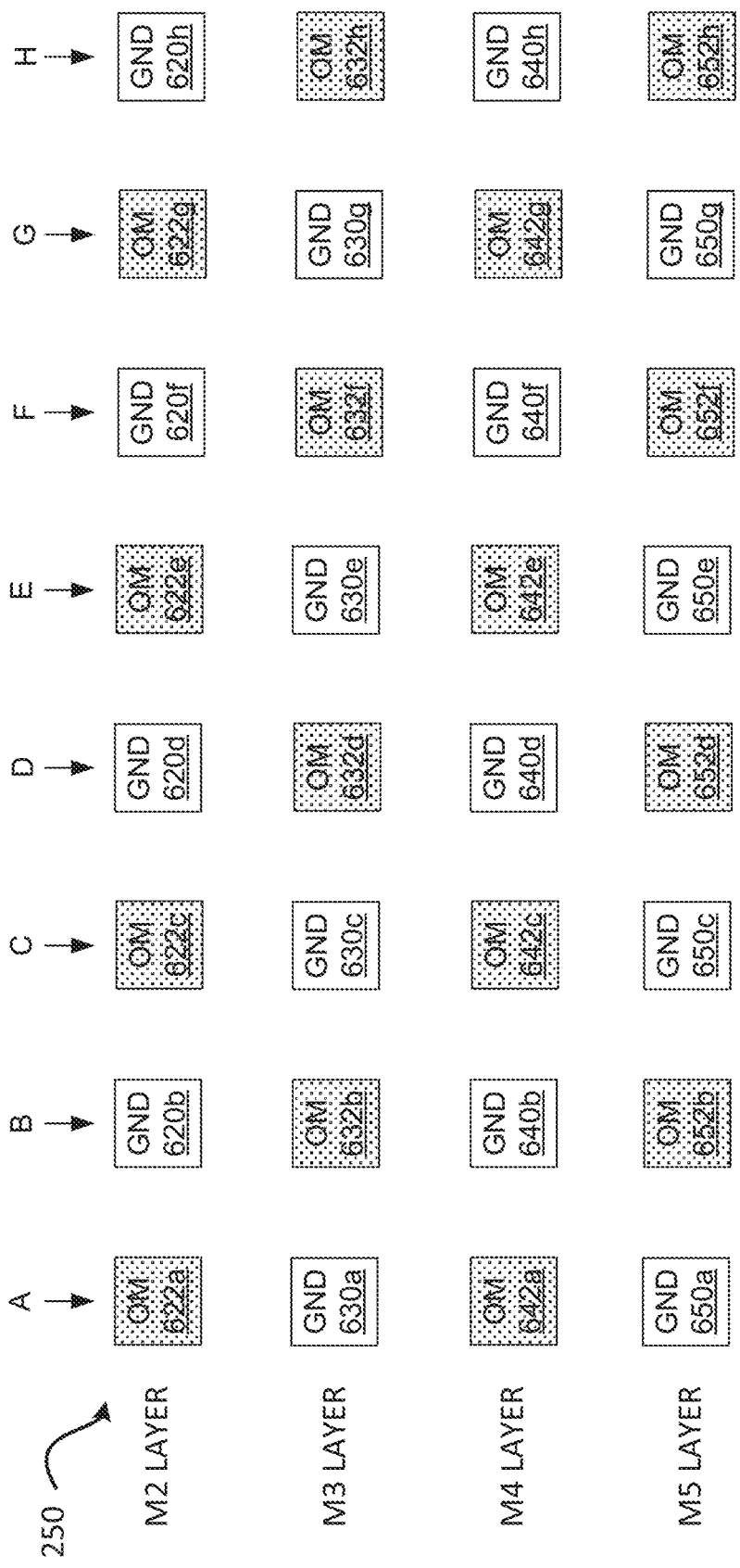
FIG. 9 illustrates a profile view of several metal layers of a capacitor configured for power amplifier output match.

The rows of ground capacitor interconnects and the rows of capacitor interconnects of the capacitor 250 may be arranged in a checkboard pattern, as illustrated and described in FIG. 9. The rows of ground capacitor interconnects and the rows of capacitor interconnects of the capacitor 250 may be arranged in an interleaved pattern (e.g., alternating between ground capacitor interconnect and capacitor interconnect). For example, for a given metal layer, interconnects for a capacitor may alternate between a ground capacitor interconnect and a capacitor interconnect. Similarly, for a column of interconnects on several metal layers, interconnects for a capacitor may alternate between a ground capacitor interconnect and a capacitor interconnect. This arrangement of ground capacitor interconnects and capacitor interconnects may help reduce parasitic inductance in the capacitor 250, which helps improve the performance of the capacitor 250.

Figure 7:
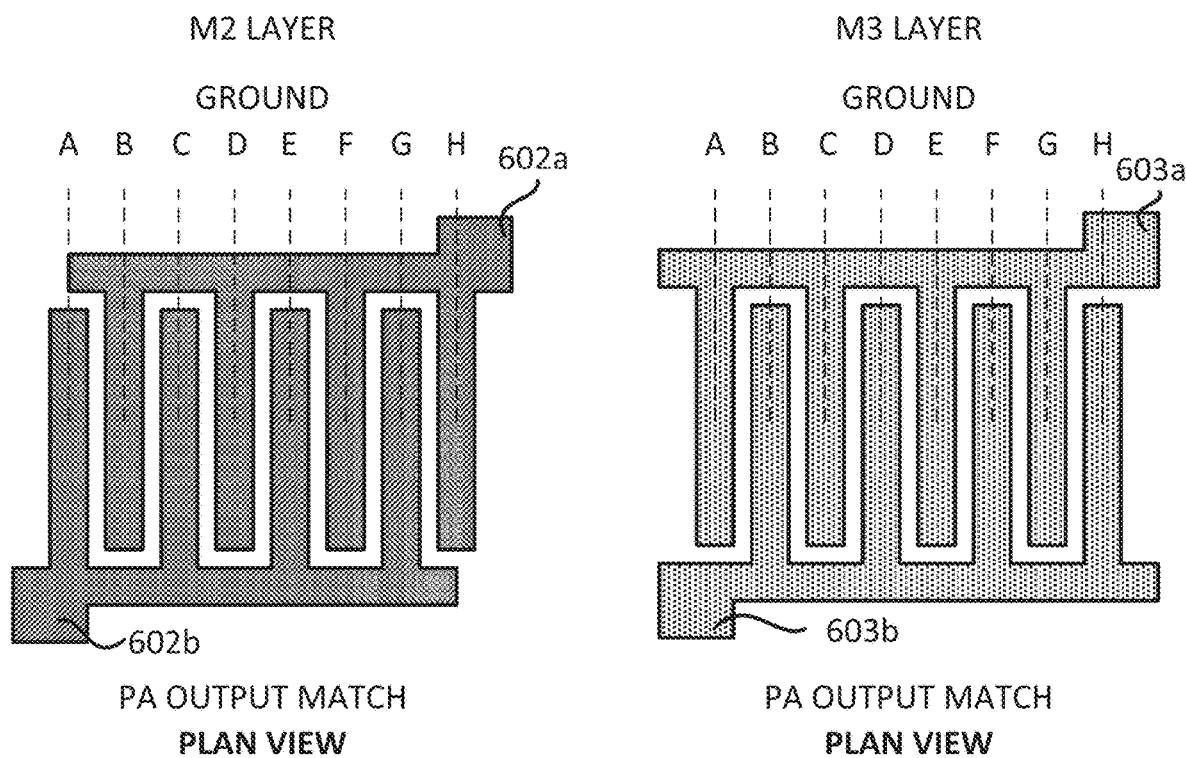
FIG. 7 illustrates a plan view of two metal layers of a capacitor configured for power amplifier output match.

FIG. 7 illustrates a plan view of the first ground node 602a of the capacitor 250, and the first output match node 602b of the capacitor 250. The first ground node 602a includes first ground capacitor interconnects 620b, 620d, 620f and 620h, that are arranged in rows. The first output match node 602b includes first capacitor interconnects 622a, 622c, 622e and 622g, that are arranged in rows. The first ground capacitor interconnects and the first capacitor interconnects are arranged on a first metal layer of the substrate such that the first ground capacitor interconnects are interleaved (e.g., laterally interleaved) with the first capacitor interconnects. For example, the first ground capacitor interconnects and the first capacitor interconnects are formed on the first metal layer such that they alternate back and forth on the first metal layer.

FIG. 7 also illustrates a plan view of the second ground node 603a of the capacitor 250, and the second output match node 603b of the capacitor 250. The second ground node 603a includes second ground capacitor interconnects 630a, 630c, 630e and 630g, that are arranged in rows. The second output match node 603b includes second capacitor interconnects 632b, 632d, 632f and 632h, that are arranged in rows. The second ground capacitor interconnects and the second capacitor interconnects are arranged on a second metal layer of the substrate such that the second ground capacitor interconnects are interleaved (e.g., laterally interleaved) with the second capacitor interconnects. For example, the second ground capacitor interconnects and the second capacitor interconnects are formed on the second metal layer such that they alternate back and forth on the second metal layer.

Figure 8:
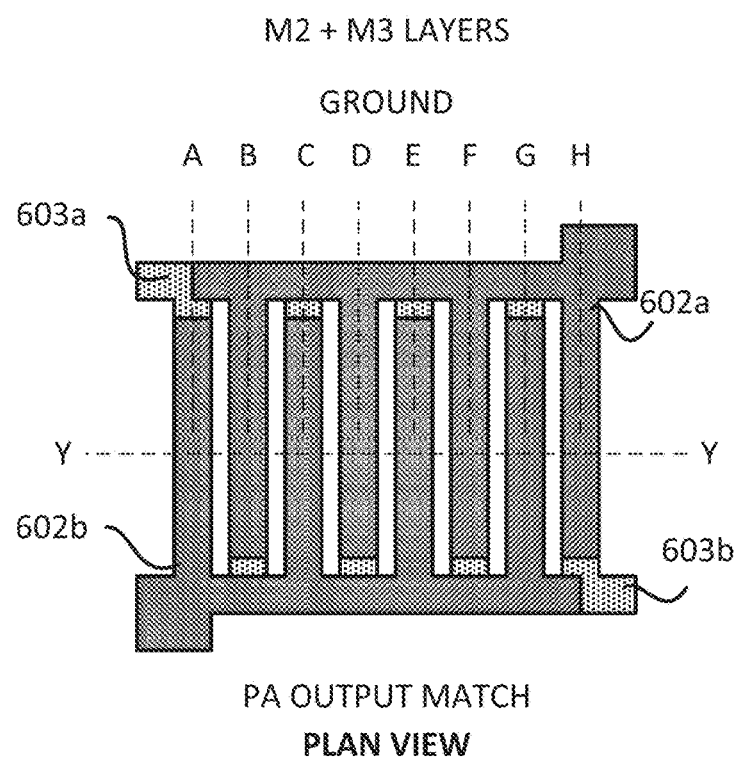
FIG. 8 illustrates a plan view of two metal layers of a capacitor configured for power amplifier output match.

FIG. 8 illustrates a plan view of the first ground node 602a and the first output match node 602b overlapped with the second ground node 603a and the second output match node 603b.

FIG. 9 illustrates a profile view across the YY cross section of the capacitor 250. The capacitor 250 includes a plurality of rows of ground capacitor interconnects and a plurality of rows of capacitor interconnects. For a given metal layer, the rows of ground capacitor interconnects and the rows of capacitor interconnects of the capacitor 250 may be arranged in an interleaved pattern (e.g., alternating between ground capacitor interconnect and capacitor interconnect, laterally interleaved pattern). For example, for a given metal layer, interconnects for a capacitor may alternate between a ground capacitor interconnect and a capacitor interconnect. Similarly, for a column (e.g., Column A, Column B, . . . , Column H) of interconnects across several metal layers, interconnects for the capacitor 250 may alternate between a ground capacitor interconnect and a capacitor interconnect. The pattern of the ground capacitor interconnects and the capacitor interconnects may a checkerboard pattern.

As shown in FIG. 9, (i) the capacitor interconnect 622a, the ground capacitor interconnect 630a, the capacitor interconnect 642a and the ground capacitor interconnect 650a at least partially vertically overlap, (ii) the ground capacitor interconnect 620b, the capacitor interconnect 632b, the ground capacitor interconnect 640b and the capacitor interconnect 652b at least partially vertically overlap, (iii) the capacitor interconnect 622c, the ground capacitor interconnect 630c, the capacitor interconnect 642c and the ground capacitor interconnect 650c at least partially vertically overlap, (iv) the ground capacitor interconnect 620d, the capacitor interconnect 632d, the ground capacitor interconnect 640d and the capacitor interconnect 652d at least partially vertically overlap, (v) the capacitor interconnect 622e, the ground capacitor interconnect 630e, the capacitor interconnect 642e and the ground capacitor interconnect 650e at least partially vertically overlap, (vi) the ground capacitor interconnect 620f, the capacitor interconnect 632f, the ground capacitor interconnect 640f and the capacitor interconnect 652f at least partially vertically overlap, (vii) the capacitor interconnect 622g, the ground capacitor interconnect 630g, the capacitor interconnect 642g and the ground capacitor interconnect 650g at least partially vertically overlap, and (viii) the ground capacitor interconnect 620h, the capacitor interconnect 632h, the ground capacitor interconnect 640h and the capacitor interconnect 652h at least partially vertically overlap.

This arrangement of ground capacitor interconnects and capacitor interconnects may help reduce parasitic inductance in the capacitor 250, which helps improve the performance of the capacitor 250.

Exemplary a Sequence for Fabricating a Substrate

In some implementations, fabricating a substrate includes several processes. FIGS. 10A-10D illustrate an exemplary sequence for providing or fabricating a substrate that includes a capacitor and inductor. In some implementations, the sequence of FIGS. 10A-10D may be used to provide or fabricate the substrate 302 of FIG. 3. However, the process of FIGS. 10A-10D may be used to fabricate any of the substrates described in the disclosure.

It should be noted that the sequence of FIGS. 10A-10D may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 10A:
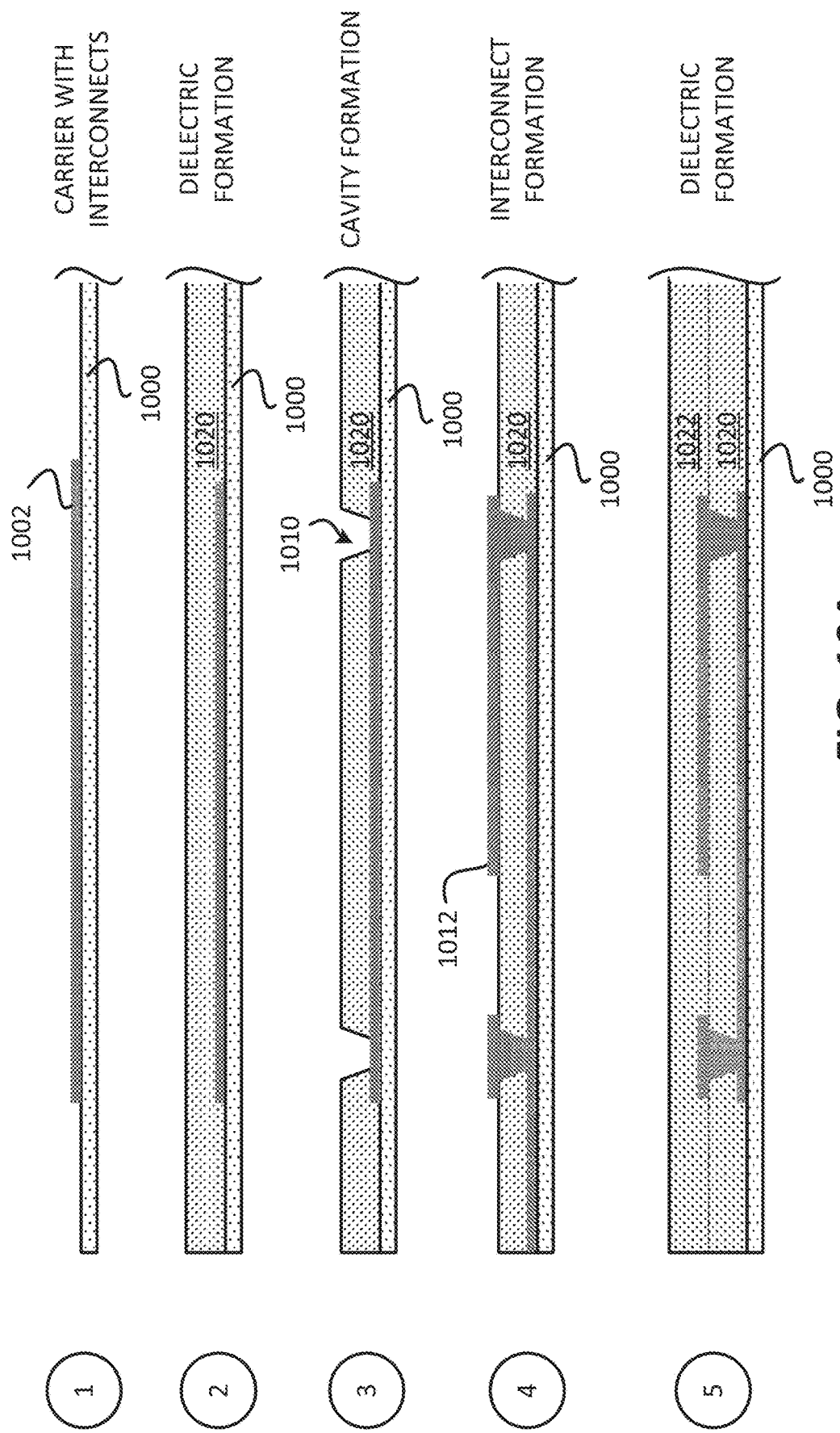
FIGS. 10A-10D illustrate an exemplary sequence for fabricating a substrate that includes a capacitor configured for power amplifier output match.

Stage 1, as shown in FIG. 10A, illustrates a state after a carrier 1000 is provided and a metal layer is formed over the carrier 1000. The metal layer may be patterned to form interconnects 1002. A plating process and etching process may be used to form the metal layer and interconnects.

Stage 2 illustrates a state after a dielectric layer 1020 is formed over the carrier 1000 and the interconnects 1002. The dielectric layer 1020 may include polyimide. However, different implementations may use different materials for the dielectric layer.

Stage 3 illustrates a state after a plurality of cavities 1010 is formed in the dielectric layer 1020. The plurality of cavities 1010 may be formed using an etching process (e.g., photo etching process) or laser process.

Stage 4 illustrates a state after interconnects 1012 are formed in and over the dielectric layer 1020. For example, a via, pad and/or traces may be formed. A plating process may be used to form the interconnects.

Stage 5 illustrates a state after another dielectric layer 1022 is formed over the dielectric layer 1020. The dielectric layer 1022 may be the same material as the dielectric layer 1020. However, different implementations may use different materials for the dielectric layer.

Figure 10B:
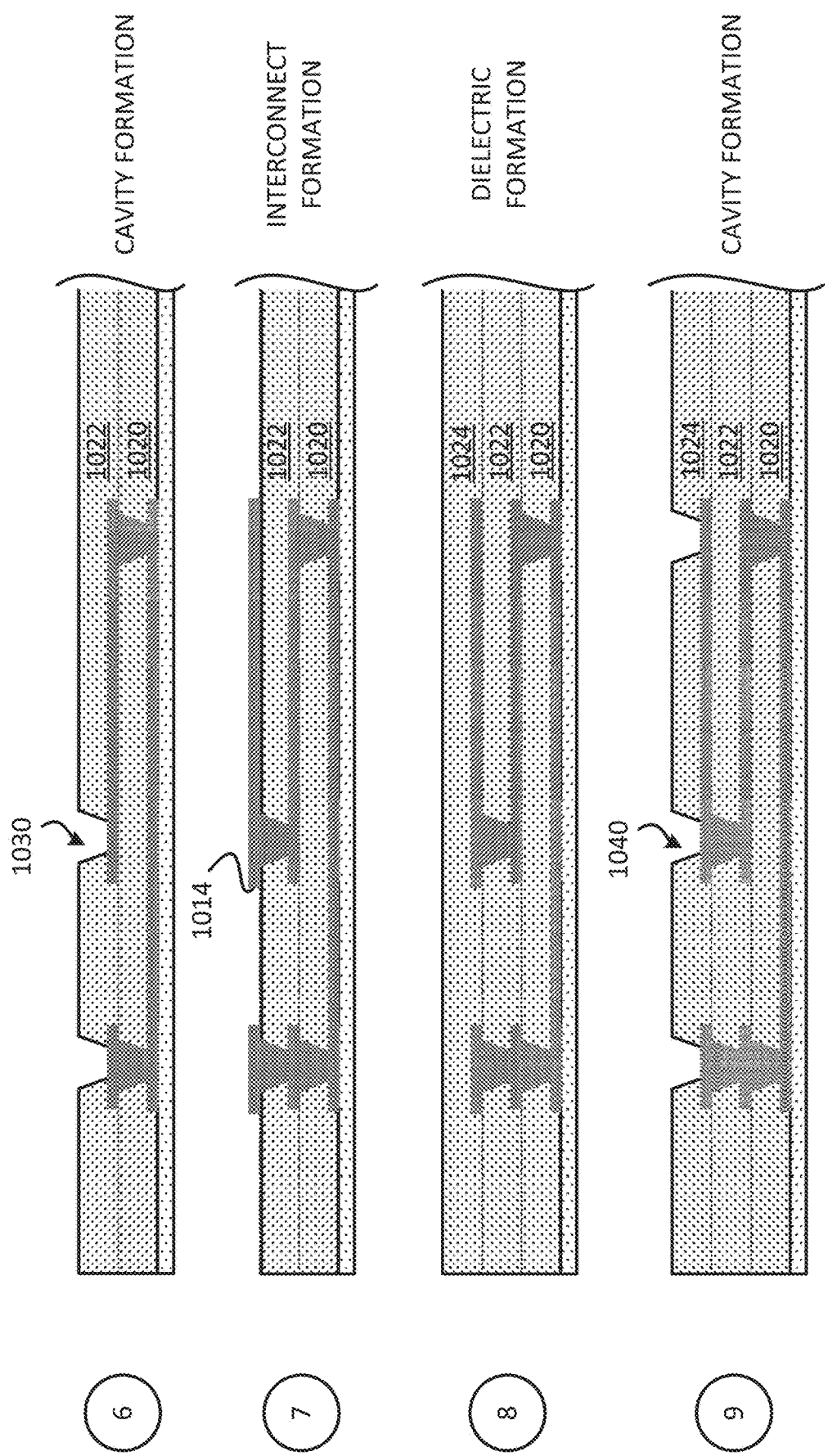

Stage 6, as shown in FIG. 10B, illustrates a state after a plurality of cavities 1030 is formed in the dielectric layer 1022. An etching process or laser process may be used to form the cavities 1030.

Stage 7 illustrates a state after interconnects 1014 are formed in and over the dielectric layer 1022. For example, via, pad and/or trace may be formed. A plating process may be used to form the interconnects.

Stage 8 illustrates a state after another dielectric layer 1024 is formed over the dielectric layer 1022. The dielectric layer 1024 may be the same material as the dielectric layer 1020. However, different implementations may use different materials for the dielectric layer.

Stage 9 illustrates a state after a plurality of cavities 1040 is formed in the dielectric layer 1024. An etching process or laser process may be used to form the cavities 1040.

Figure 10C:
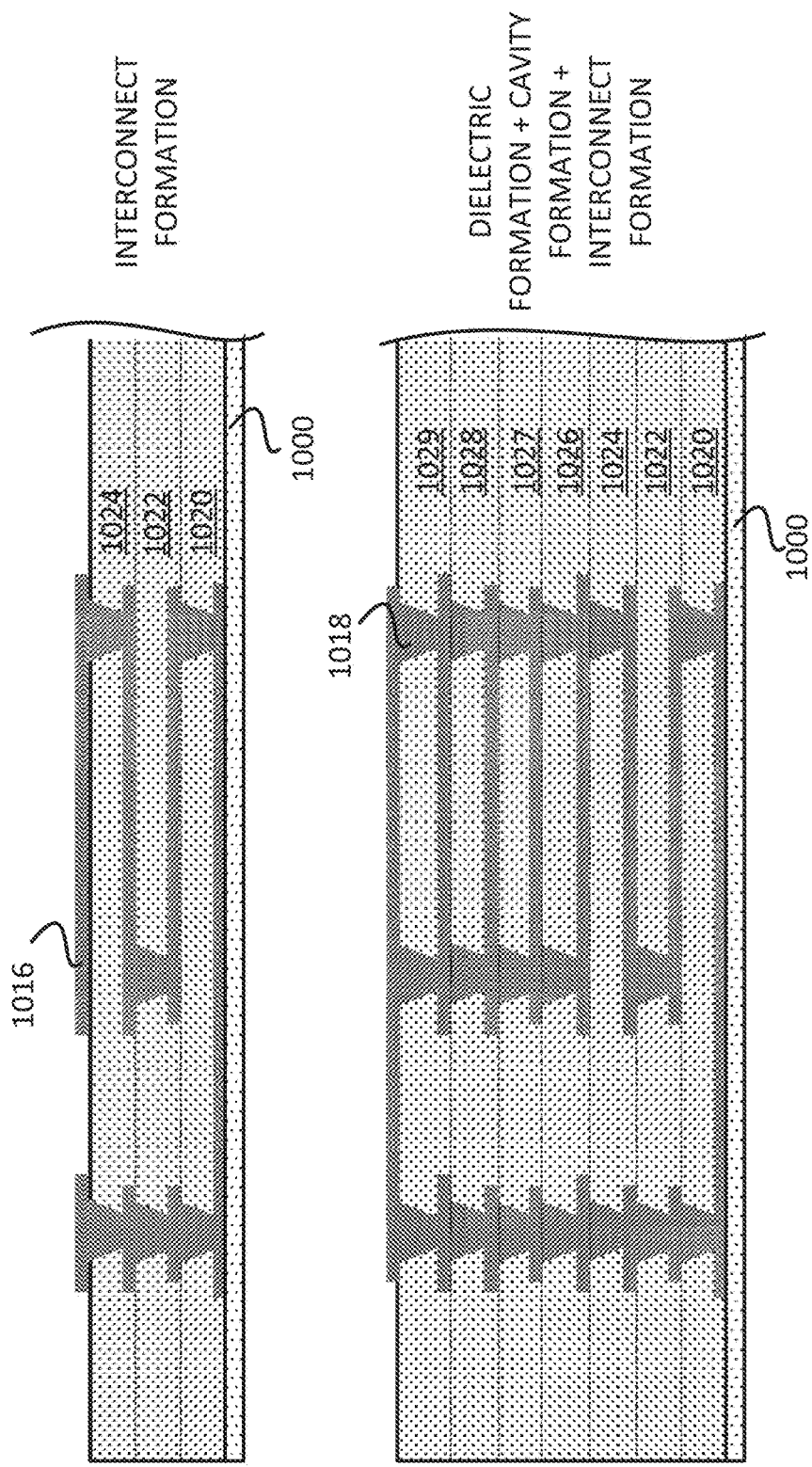

Stage 10, as shown in FIG. 10C, illustrates a state after interconnects 1016 are formed in and over the dielectric layer 1024. For example, via, pad and/or trace may be formed. A plating process may be used to form the interconnects.

Stage 11 illustrates a state after dielectric layers (e.g., 1026, 1027, 1028, 1029) and interconnects 1018 are formed. In some implementations, forming the dielectric layers and the interconnects 1018 may include an iterative process of forming a dielectric layer, forming cavities in the dielectric layer and forming over the dielectric layer and cavities. For example, Stages 8-10 of FIGS. 10B-10C may be iteratively repeated to form the dielectric layers and interconnects. A deposition process may be used to form the dielectric layers. An etching process or a laser process may be used to form the cavities. A plating process may be used to form the interconnects.

Some or all of the interconnects 1002, 1012, 1014, 1016 and/or 1018 may define the plurality of interconnects 230, the at least one interconnect 232, the plurality of ground interconnects 234, the at least one bottom ground interconnect 246, the capacitor 250 and/or an inductor 340. The dielectric layers 1020, 1022, 1024, 1026, 1027, 1028, 1029 may be represented by the at least one dielectric layer 220.

Figure 10D:
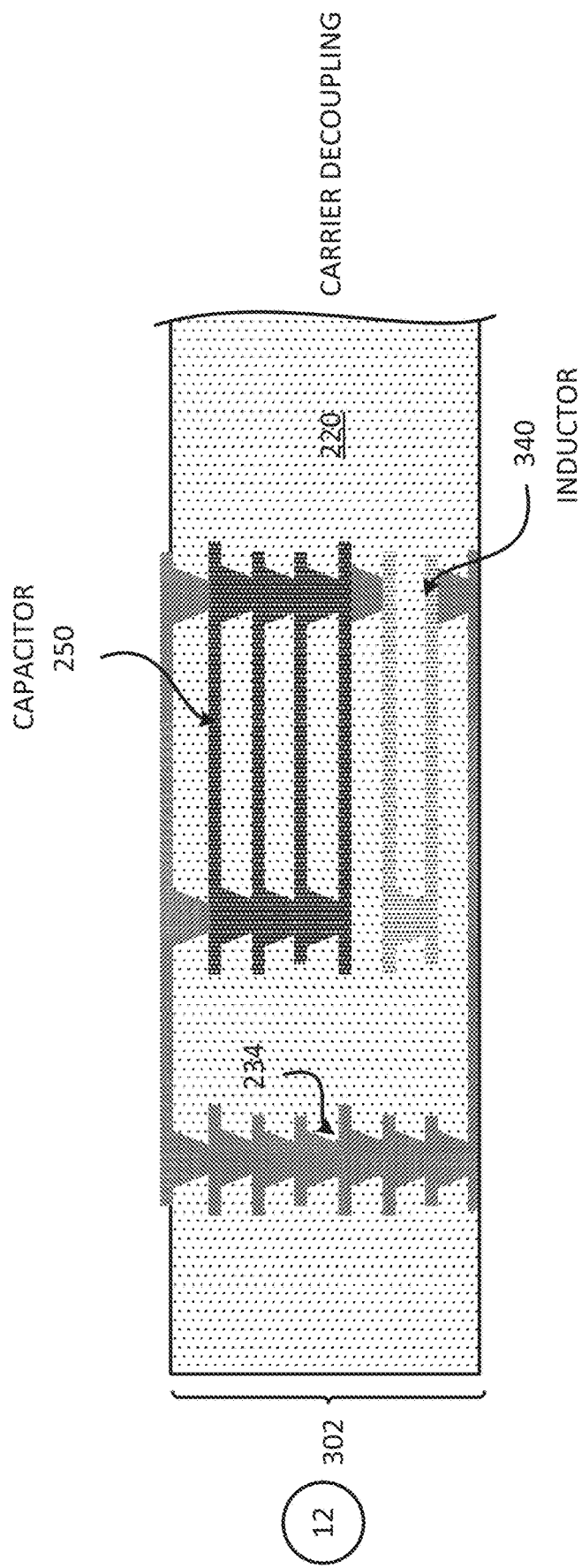

Stage 12, as shown in FIG. 10D, illustrates a state after the carrier 1000 is decoupled (e.g., removed, grinded out) from the at least one dielectric layer 220, leaving the substrate 302. Stage 12 may illustrate the substrate 302 that includes the capacitor 250 and the inductor 340.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 11:
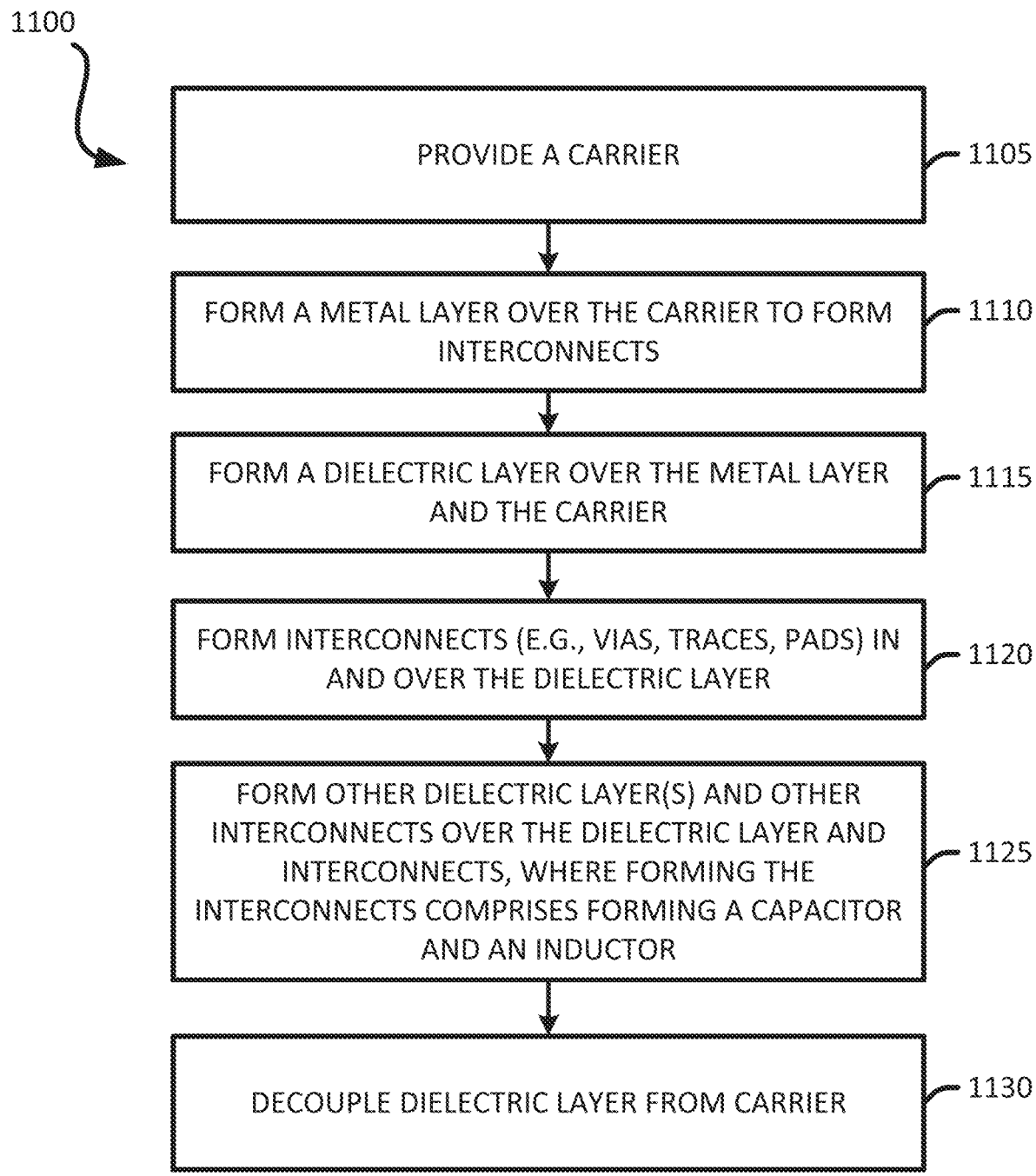
FIG. 11 illustrates an exemplary flow diagram of a method for fabricating a substrate that includes a capacitor configured for power amplifier output match.

In some implementations, fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate of FIG. 3. For example, the method of FIG. 11 may be used to fabricate the substrate 302.

It should be noted that the method of FIG. 11 may combine one or more processes in order to simplify and/or clarify the method for providing or fabricating a substrate. In some implementations, the order of the processes may be changed or modified.

The method provides (at 1105) a carrier 1000. Different implementations may use different materials for the carrier. The carrier may include a substrate, glass, quartz and/or carrier tape. Stage 1 of FIG. 10A illustrates an example of a carrier that is provided.

The method forms (at 1110) a metal layer over the carrier 1000. The metal layer may be patterned to form interconnects. A plating process may be used to form the metal layer and interconnects. Stage 1 of FIG. 10A illustrates an example of metal layer and interconnects formation.

The method forms (at 1115) a dielectric layer (e.g., 1020) over the carrier 1000 and the interconnects 1002. The dielectric layer 1020 may include polyimide. Forming the dielectric layer may also include forming a plurality of cavities (e.g., 1010) in the dielectric layer (e.g., 1020). The plurality of cavities may be formed using an etching process (e.g., photo etching) or laser process. Stages 2-3 of FIG. 10A illustrate an example of dielectric layer and cavity formation.

The method forms (at 1120) interconnects in and over the dielectric layer. For example, the interconnects 1012 may be formed in and over the dielectric layer 1020. A plating process may be used to form the interconnects. Forming interconnects may include providing a patterned metal layer over and/or in the dielectric layer. Stage 4 of FIG. 10A illustrates an example of interconnect formation.

The method forms (at 1125) additional dielectric layers (e.g., 1022) over the dielectric layer (e.g., 1020) and the interconnects. The dielectric layer (e.g., 1022) may include polyimide. Forming the dielectric layer may also include forming a plurality of cavities (e.g., 1030) in the dielectric layer (e.g., 1022). The plurality of cavities may be formed using an etching process or laser process. The method forms (at 1125) interconnects over the dielectric layer. A plating process may be used to form the interconnects. Forming interconnects may include providing a patterned metal layer over and/or in the dielectric layer. Forming the interconnects may include forming the plurality of interconnects 230, the at least one interconnect 232, the plurality of ground interconnects 234, the at least one bottom ground interconnect 246, the capacitor 250 and an inductor 340. Stages 5-11 of FIGS. 10A-10C illustrate examples of dielectric layer and interconnect formation. Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Once all the dielectric layer(s) and additional interconnects are formed, the method may decouple (at 1130) the carrier (e.g., 1000) from the dielectric layer 1020, leaving the substrate 302. In some implementations, the method may form solder resist layers over the substrate. Stage 12 of FIG. 10D illustrates an example of carrier decoupling.

Figure 12:
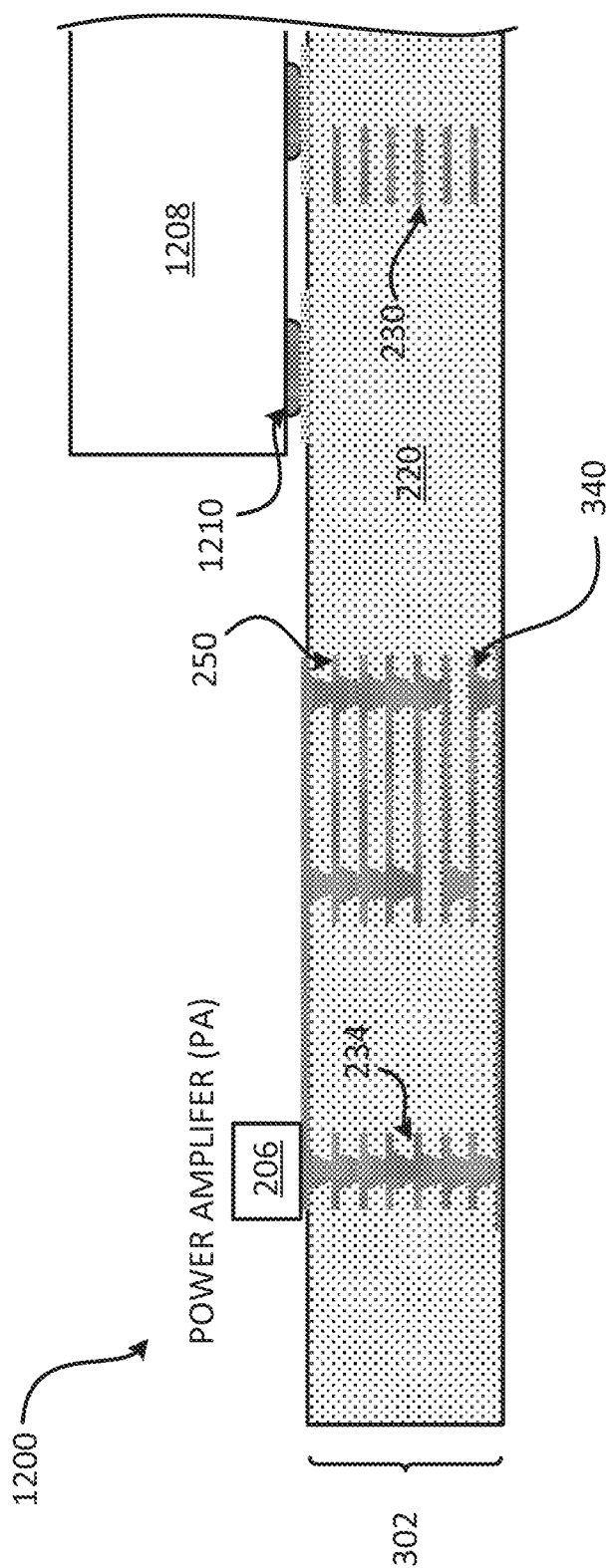
FIG. 12 illustrates a profile view of a package that includes an integrated device and a substrate that includes a capacitor configured for power amplifier output match.

Exemplary Package Comprising Substrate Having a Capacitor Configured as an Output Match Element FIG. 12 illustrates a package 1200 that includes the substrate 302, the power amplifier 206 and an integrated device 1208. The package 1200 may be implemented in a device. The integrated device 1208 is coupled to the substrate 302 through the plurality of solder interconnects 1210.

The substrate 302 includes the plurality of interconnects 230, at least one interconnect 232, the plurality of ground interconnects 234, at least one bottom ground interconnect 246, the capacitor 250 and an inductor 340. The inductor 340 may be formed from at least one inductor interconnect. The inductor 340 may be formed on at least one metal layer of the substrate 302. The inductor 340 may include a spiral inductor.

The inductor 340 is configured to be coupled (e.g., electrically coupled) to the capacitor 250. At least one interconnect may be used to couple the inductor 340 to the capacitor 250, and vice versa. The capacitor 250 may be located over the inductor 340 in the substrate. Both the capacitor 240 and the inductor 340 may be embedded in the substrate 302. The combination of the capacitor 250 and the inductor 340 may be configured to operate as a resonant trap or an output match element for the power amplifier 206. The output matching that is provided by the capacitor 250 and the inductor 340 may be impedance matching that helps match the output impedance of the power amplifier 206 to an input load to another component (e.g., integrated device 1208) so as to maximize energy transfer between the power amplifier 206 and the other component (e.g., integrated device 1208).

The power amplifier 206 may be coupled to the inductor 340 through the plurality of ground interconnects 234 and the at least one bottom ground interconnect 246. For example, ground may travel between the power amplifier 206 and the inductor 340 through the plurality of ground interconnects 234 and the at least one bottom ground interconnect 246. It is noted that the at least one bottom ground interconnect 246 may be an interconnect located on the lowest metal layer of the substrate 302 or interconnect located on any of the metal layer of the substrate 302. The at least one bottom ground interconnect 246 may be an interconnect located on a metal layer that is below the inductor 340.

The power amplifier 206 may be electrically coupled to the capacitor 250 through at least one interconnect 232. At least one electrical current (e.g., electrical signal) may travel between the power amplifier 206 and the capacitor 250 through the at least one interconnect 232. The power amplifier 206, the capacitor 250, and/or the inductor 340 may be coupled to the integrated device 1208 through the plurality of interconnects 230.

An integrated device (e.g., 1208) may include a die (e.g., bare die). The integrated device may include a radio frequency (RF) device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a silicon carbide (SiC) based integrated device, memory, and/or combinations thereof.

Instead of the substrate 302, the package 1200 may include any of the substrates described in the disclosure. The package 1200 may be implemented as a radio frequency front end (RFFE) package.

Exemplary Sequence for Fabricating a Package that Includes a Substrate Having a Capacitor Configured as an Output Match Element FIG. 13 illustrates an exemplary sequence for providing or fabricating a package that includes a substrate having a capacitor configured as an output match element. In some implementations, the sequence of FIG. 13 may be used to provide or fabricate the package 1200, or any package described in the disclosure.

It should be noted that the sequence of FIG. 13 may combine one or more stages in order to simplify and/or clarify the sequence for providing or fabricating the package that includes a substrate having a capacitor configured as an output match element. In some implementations, the order of the processes may be changed or modified. In some implementations, one or more of processes may be replaced or substituted without departing from the spirit of the disclosure. The sequence of FIG. 13 may be used to fabricate one package or several packages at a time (as part of a wafer).

Stage 1, as shown in FIG. 13, illustrates a state after a substrate 302 is provided. The substrate 302 includes a capacitor 250 and an inductor 340. Different implementations may provide different substrates (e.g., 202, 402). The substrate 302 may be provided by a supplier or fabricated using a process as described in FIGS. 10A-10D.

Stage 2 illustrates a state after the integrated device 1208 is coupled to the substrate 302. Solder interconnects may be used to couple the integrated device 1208 to the substrate 302. A reflow process may be used to couple the integrated device 1208 to the substrate 302. The integrated device 1208 may be coupled to the substrate 302 such that the integrated device 1208 is configured to be electrically coupled to the capacitor 250 and the inductor 340.

Stage 3 illustrates a state after the power amplifier 206 is coupled to the substrate 302. A pick and place process may be used to couple the power amplifier 206 to the substrate 302. The power amplifier 206 may be coupled to the substrate 302 such that the power amplifier 206 is configured to be electrically coupled to the capacitor 250 and the inductor 340. Stage 3 may illustrate a package 1200 that includes the substrate 302, the power amplifier 206, the integrated device 1208. The capacitor 250 and the inductor 340 may be embedded in the substrate 302.

Exemplary Flow Diagram of a Method for Fabricating a Package that Includes a Substrate Having a Capacitor Configured as an Output Match Element In some implementations, fabricating a package that includes a substrate having a capacitor configured as an output match element includes several processes. FIG. 14 illustrates an exemplary flow diagram of a method 1400 for providing or fabricating a package that includes a substrate having a capacitor configured as an output match element. In some implementations, the method 1400 of FIG. 14 may be used to provide or fabricate the package 1200 of FIG. 12 described in the disclosure. However, the method 1400 may be used to provide or fabricate any of the packages described in the disclosure.

It should be noted that the sequence of FIG. 14 may combine one or more processes in order to simplify and/or clarify the method for providing or fabricating a package that includes a substrate having a capacitor configured as an output match element. In some implementations, the order of the processes may be changed or modified.

The method provides (at 1405) a substrate (e.g., 302) that includes a capacitor (e.g., 250) and an inductor (e.g., 340). Different implementations may provide different substrates (e.g., 202, 402). The capacitor may be configured as an output match element. The capacitor and the inductor may be configured as an output match element The capacitor may be configured to help dissipate heat. Providing the substrate may include forming at least one dielectric layer, forming a plurality of interconnects, forming a capacitor configured to operate as an output match element, where the capacitor is defined by a plurality of capacitor interconnects. FIGS. 10A-10D illustrate an example of providing or fabricating a substrate that includes a capacitor and/or inductor. Stage 1 of FIG. 13 illustrates an example of a substrate that includes a capacitor.

The method couples (at 1410) an integrated device (e.g., 1208) to the substrate (e.g., 302). Solder interconnects may be used to couple the integrated device 1208 to the substrate 302. A reflow process may be used to couple the integrated device 1208 to the substrate 302. The integrated device may be coupled (e.g., directly or indirectly) to the capacitor and/or inductor. Stage 2 of FIG. 13 illustrates an example of coupling an integrated device to a substrate.

The method couples (at 1415) a power amplifier (e.g., 206) to the substrate (e.g., 302). A pick and place process may be used to couple the power amplifier 206 to the substrate 302. The power amplifier may be coupled (e.g., directly or indirectly) to the capacitor. The capacitor is configured to operate as an output match element for the power amplifier. Stage 3 of FIG. 13 illustrates an example of coupling a power amplifier to a substrate such that the power amplifier is coupled (e.g., directly or indirectly) to a capacitor.

Exemplary Electronic Devices

Figure 15:
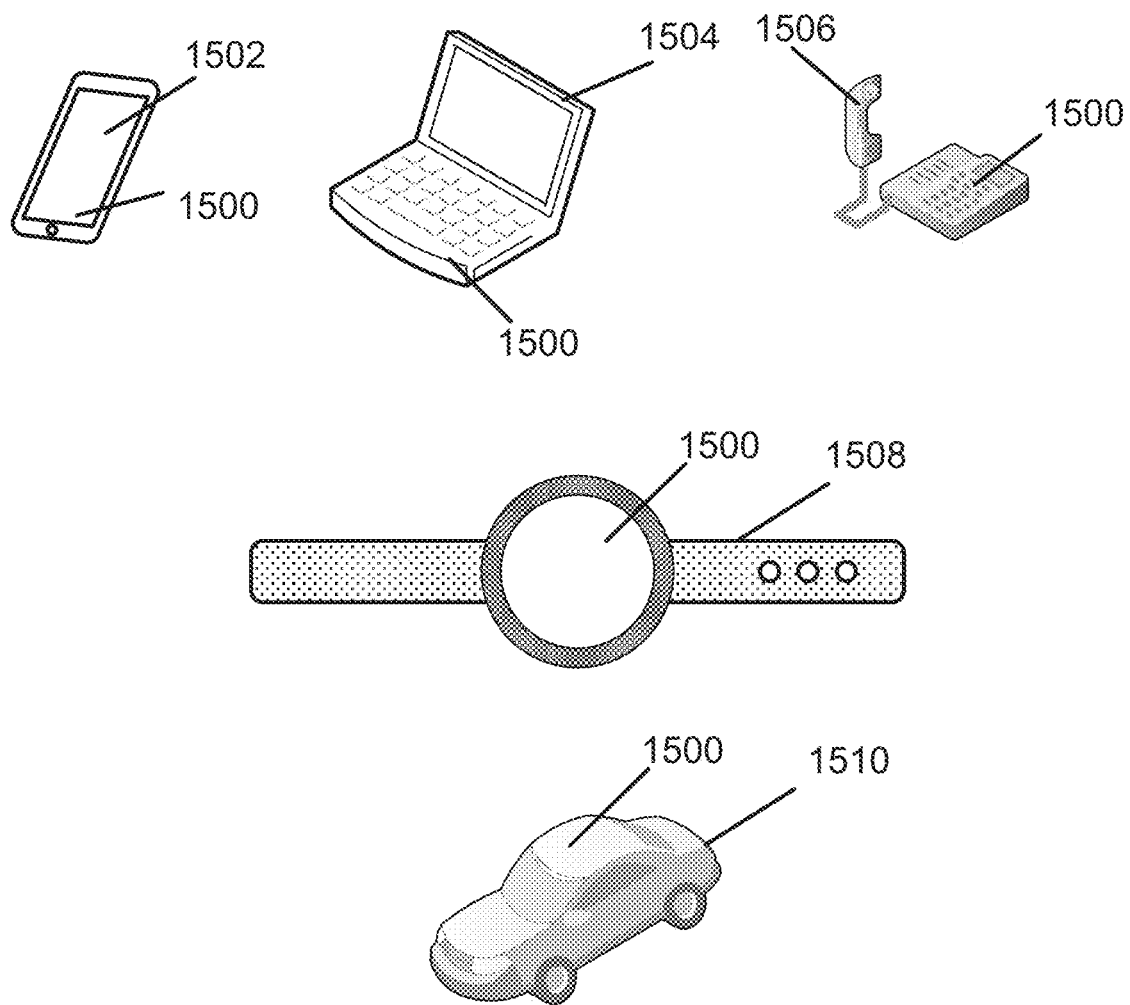
FIG. 15 illustrates various electronic devices that may integrate a die, an integrated device, an integrated passive device (IPD), a passive component, a package, and/or a device package described herein.

FIG. 15 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or integrated circuit (IC) packages described herein. The devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-9, 10A-10D and/or 11-15 may be rearranged and/or combined into a single component, process, feature or function or embodied in several components, processes, or functions. Additional elements, components, processes, and/or functions may also be added without departing from the disclosure. It should also be noted FIGS. 2-9, 10A-10D and/or 11-15 and its corresponding description in the present disclosure is not limited to dies and/or ICs. In some implementations, FIGS. 2-9, 10A-10D and/or 11-15 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may include more than one element or component. An interconnect may be defined by one or more interconnects. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
 a substrate comprising:
  at least one dielectric layer;
  a plurality of interconnects; and
  a capacitor defined by a plurality of capacitor interconnects, wherein the capacitor comprises:
   a first ground node located on a first metal layer of the substrate;
   a first output match node located on the first metal layer of the substrate;
   a second ground node located on a second metal layer of the substrate, wherein the second ground node vertically overlaps with the first output match node; and
   a second output match node located on the second metal layer of the substrate, wherein the second output match node vertically overlaps with the first ground node; and
 a power amplifier coupled to the substrate,
  wherein the power amplifier is coupled to the capacitor, and
  wherein the capacitor is configured to operate as an output match element for the power amplifier.

2. The device of claim 1, wherein the substrate comprises an inductor coupled to the capacitor, wherein the inductor is defined by at least one inductor interconnect.

3. The device of claim 2, wherein the capacitor and the inductor are configured to operate as a resonant trap or the output match element.

4. The device of claim 2, wherein the power amplifier is coupled to the capacitor through the inductor.

5. The device of claim 2, wherein the power amplifier is coupled to the inductor through the capacitor.

6. The device of claim 1, wherein the substrate comprises a plurality of ground interconnects coupled to the capacitor and the power amplifier.

7. The device of claim 6, wherein the plurality of ground interconnects comprises at least one bottom ground interconnect located a bottom metal layer of the substrate.

8. The device of claim 1,
 wherein the first ground node includes (i) a first ground capacitor interconnect located on the first metal layer of the substrate, and (ii) a second ground capacitor interconnect located on the first metal layer of the substrate,
 wherein the second output match node includes (i) a first capacitor interconnect located on the second metal layer of the substrate, and (ii) a second capacitor interconnect located on the second metal layer of the substrate,
 wherein the first capacitor interconnect vertically overlaps with the first ground capacitor interconnect, and
 wherein the second capacitor interconnect vertically overlaps with the second ground capacitor interconnect.

9. The device of claim 8,
 wherein the first output match node includes (i) a third capacitor interconnect located on the first metal layer of the substrate, and (ii) a fourth capacitor interconnect located on the first metal layer of the substrate,
 wherein the second ground node includes (i) a third ground capacitor interconnect located on the second metal layer of the substrate, and (ii) a fourth ground capacitor interconnect located on the second metal layer of the substrate,
 wherein the third capacitor interconnect vertically overlaps with the third ground capacitor interconnect, wherein the fourth capacitor interconnect vertically overlaps with the fourth ground capacitor interconnect,
wherein a vertical overlap between the second ground node and the first output match node is at least a partial vertical overlap,
wherein a vertical overlap between the second output match node and the first ground node is at least a partial vertical overlap, and
wherein the first ground capacitor interconnect, the second ground capacitor interconnect, the third ground capacitor interconnect, the fourth ground capacitor interconnect, the first capacitor interconnect, the second capacitor interconnect, the third capacitor interconnect, and the fourth capacitor interconnect are configured in a profile checkerboard pattern.

10. The device of claim 1, wherein the capacitor is configured as a heat spreader to dissipate heat generated from the power amplifier.

11. The device of claim 1, wherein the capacitor includes a capacitance of 0.9 picofarad (pF), an area of 0.4 millimeters (mm)×0.45 mm, and a capacitor junction temperature of 23 degrees Celsius or less when approximately 1 Watt of power is provided by the power amplifier.

12. The device of claim 1, further comprising an integrated device coupled to the substrate.

13. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

14. An apparatus comprising:
a substrate comprising:
at least one dielectric layer;
a plurality of interconnects;
means for capacitance configured to operate as an output match element, wherein the means for capacitance comprises:
a first ground node located on a first metal layer of the substrate;
a first output match node located on the first metal layer of the substrate;
a second ground node located on a second metal layer of the substrate, wherein the second ground node vertically overlaps with the first output match node; and
a second output match node located on the second metal layer of the substrate, wherein the second output match node vertically overlaps with the first ground node; and
means for inductance coupled to the means for capacitance, wherein the means for inductance vertically overlaps with the means for capacitance; and
means for power amplification coupled to the substrate,
wherein the means for power amplification is coupled to the means for capacitance, and
wherein the means for capacitance is configured to operate as the output match element for the means for power amplification.

15. The apparatus of claim 14,
wherein a vertical overlap between the second ground node and the first output match node is at least a partial vertical overlap,
wherein a vertical overlap between the second output match node and the first ground node is at least a partial vertical overlap, and
wherein interconnects from (i) the first ground node, (ii) the first output match node, (iii) the second ground node and (iv) the second output match node, are arranged in a profile checkerboard pattern.

16. The apparatus of claim 14, wherein the means for capacitance and the means for inductance are configured to operate as resonant trap or the output match element.

17. The apparatus of claim 14, wherein the means for power amplification is coupled to the means for capacitance through the means for inductance.

18. The apparatus of claim 14, wherein the means for power amplification is coupled to the means for inductance through the means for capacitance.

19. The apparatus of claim 14, wherein the substrate comprises a plurality of ground interconnects coupled to the means for capacitance and the means for power amplification.

20. The apparatus of claim 14, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

21. A method for fabricating a device, comprising:
providing a substrate comprising:
forming at least one dielectric layer;
forming a plurality of interconnects; and
forming a capacitor defined by a plurality of capacitor interconnects, wherein forming the capacitor comprises:
forming a first ground node on a first metal layer of the substrate;
forming a first output match node on the first metal layer of the substrate;
forming a second ground node on a second metal layer of the substrate such that the second ground node vertically overlaps with the first output match node; and
forming a second output match node on the second metal layer of the substrate such that the second output match node vertically overlaps with the first ground node; and
coupling a power amplifier coupled to the substrate,
wherein the power amplifier is coupled to the capacitor, and
wherein the capacitor is configured to operate as an output match element for the power amplifier.

22. The method of claim 21, wherein providing the substrate comprises forming an inductor that is coupled to the capacitor, wherein the inductor is defined by at least one inductor interconnect.

23. The method of claim 22, wherein the capacitor and the inductor are configured to operate as a resonant trap or the output match element.

24. The method of claim 22, wherein the power amplifier is coupled to the capacitor through the inductor.

25. The method of claim 22, wherein the power amplifier is coupled to the inductor through the capacitor.

26. The method of claim 21,
wherein forming the first ground node comprises forming (i) a first ground capacitor interconnect on the first metal layer of the substrate, and (ii) a second ground capacitor interconnect on the first metal layer of the substrate, and wherein forming the second output match node comprises forming (i) a first capacitor interconnect on the second metal layer of the substrate, and (ii) a second capacitor interconnect on the second metal layer of the substrate, wherein the first capacitor interconnect vertically overlaps with the first ground capacitor interconnect, and wherein the second capacitor interconnect vertically overlaps with the second ground capacitor interconnect.

27. The method of claim 26, wherein forming the first output match node comprises forming (i) a third capacitor interconnect on the first metal layer of the substrate, and (ii) a fourth capacitor interconnect on the first metal layer of the substrate, wherein forming the second ground node comprises forming (i) a third ground capacitor interconnect on the second metal layer of the substrate, and (ii) a fourth ground capacitor interconnect on the second metal layer of the substrate, wherein the third capacitor interconnect vertically overlaps with the third ground capacitor interconnect, wherein the fourth capacitor interconnect vertically overlaps with the fourth ground capacitor interconnect, and wherein the first ground capacitor interconnect, the second ground capacitor interconnect, the third ground capacitor interconnect, the fourth ground capacitor interconnect, the first capacitor interconnect, the second capacitor interconnect, the third capacitor interconnect, and the fourth capacitor interconnect are configured in a profile checkerboard pattern.

\* \* \* \* \*